United States Patent
Chen

(10) Patent No.: US 9,275,931 B2
(45) Date of Patent: Mar. 1, 2016

(54) HEAT DISSIPATING MODULE

(76) Inventor: Huang-han Chen, New Taipei (TW)

(*) Notice: Subject to any disclaimer, the term of this patent is extended or adjusted under 35 U.S.C. 154(b) by 955 days.

(21) Appl. No.: 13/348,717

(22) Filed: Jan. 12, 2012

(65) Prior Publication Data

US 2013/0180697 A1  Jul. 18, 2013

(51) Int. Cl.
*H01L 21/48* (2006.01)
*H01L 23/473* (2006.01)

(52) U.S. Cl.
CPC .......... *H01L 23/473* (2013.01); *H01L 21/4882* (2013.01); *H01L 2924/0002* (2013.01)

(58) Field of Classification Search
CPC .......... F28F 3/086; F28F 3/12; F28F 2255/12; Y10S 165/36; Y10S 165/363; H01L 23/473; H01L 21/4882; H01L 2924/0002
USPC ................. 165/80.3, 80.4, 166, 167
See application file for complete search history.

(56) References Cited

U.S. PATENT DOCUMENTS

| | | | | |
|---|---|---|---|---|
| 5,193,611 A | * | 3/1993 | Hesselgreaves | 165/165 |
| 5,274,920 A | * | 1/1994 | Matthews | 29/890.039 |
| 5,381,859 A | * | 1/1995 | Minakami et al. | 165/80.3 |
| 5,423,376 A | * | 6/1995 | Julien et al. | 165/80.4 |
| 6,014,312 A | * | 1/2000 | Schulz-Harder et al. | 361/699 |
| 6,634,421 B2 | * | 10/2003 | Ognibene et al. | 165/166 |
| 6,968,892 B1 | * | 11/2005 | Symonds | 165/165 |
| 7,044,198 B2 | * | 5/2006 | Matsushima et al. | 165/80.4 |
| 7,584,781 B2 | * | 9/2009 | Lai et al. | 165/80.4 |
| 2012/0080166 A1 | * | 4/2012 | Cheng | 165/67 |

FOREIGN PATENT DOCUMENTS

WO    WO 02082536 A2 * 10/2002

* cited by examiner

*Primary Examiner* — Tho V Duong
(74) *Attorney, Agent, or Firm* — Ming Chow; Sinorica, LLC

(57) ABSTRACT

A heat dissipating module including multiple first heat dissipating fins and multiple second heat dissipating fins combined to the first heat dissipating fins is provided. Each first/second heat dissipating fin has a first/second body and multiple first/second heat dissipating groove assemblies disposed in the first/second body, wherein each first/second heat dissipating groove assembly has multiple first/second heat dissipating groove unit. One end of the first heat dissipating groove unit is overlapped to one end of the second heat dissipating groove unit adjacent thereof. The other end of the first heat dissipating groove unit is overlapped to one end of another second heat dissipating groove unit. The two second heat dissipating groove units are disposed in the second body adjacent to each other.

14 Claims, 7 Drawing Sheets

HEAT DISSIPATING MODULE

BACKGROUND OF THE INVENTION

1. Field of the Invention

The invention relates to a heat dissipating module. More particularly, the invention relates to a heat dissipating module having a preferred heat dissipating efficiency for a heat source.

2. Description of Related Art

In recent years, with the enormous progress of the computer technology, the operating speed of the computer is continuously increased, and the heat generation rate of electronic elements within a computer host continuously rises correspondingly. In order to prevent the electronic elements within the computer host from overheating to cause a temporary or permanent failure to the electronic element, how to provide sufficient heat dissipating performance to the electronic elements within the computer is accordingly important.

For example, in a computer system, for example, a center process unit (CPU), a north bridge chip, a south bridge chip, or other heat generating elements are disposed on a mother board. In the prior art, in order to remove the heat on the mother board generated during the high speed operation, a heat dissipating module is usually disposed on these heat generating elements for performing the heat dissipation.

SUMMARY OF THE INVENTION

The invention is directed to a heat dissipating module having larger contacting area with a working fluid to have a preferred heat-dissipation efficiency for a heat source.

In the invention, a heat dissipating module is adapted to heat dissipate for the heat source. The heat dissipating module includes a plurality of first heat dissipating fins and a plurality of second heat dissipating fins, the first heat dissipating fins and the second heat dissipating fins are combined with each other. Each first heat dissipating fin has a first body and a plurality of first heat dissipating groove assemblies arranged in the first body along a first direction, wherein each first heat dissipating groove assembly has a plurality of first heat dissipating grooves unit arranged in the first body along a second direction. Each second heat dissipating fin has a second body and a plurality of second heat dissipating groove assemblies arranged in the second body along the first direction, wherein each second heat dissipating groove assembly has a plurality of second heat dissipating groove units arranged in the second body along the second direction.

The first heat dissipating fins and the second heat dissipating fins are combined with each other, one end of the first heat dissipating groove unit of each first heat dissipating fin is overlapped with one end of one second heat dissipating groove unit of one second heat dissipating fin adjacent to the first heat dissipating fin, another end of the first heat dissipating groove unit is overlapped with one end of another second heat dissipating groove unit, and the two second heat dissipating groove units overlapped with the first heat dissipating groove unit are adjacent and arranged in the second body along the second direction, wherein each first heat dissipating groove assembly and each second heat dissipating groove assembly have two end portions respectively, and two of the end portions are communicated with a inlet channel and a outlet channel respectively.

In one embodiment of the present invention, wherein one end portion of the first heat dissipating groove unit is partial overlapped with one end portion of the second heat dissipating groove unit.

In one embodiment of the present invention, wherein the first heat dissipating fins are combined with the second heat dissipating fins along a fabricating direction with each other, and the first direction, the second direction, and the fabricating direction are vertical with each other.

In one embodiment of the present invention, wherein the inlet channel, the first heat dissipating groove assemblies, the second heat dissipating groove assemblies, and the outlet channel are communicated with each other to form a heat dissipating channel.

In one embodiment of the present invention, wherein at least one of each first heat dissipating fin and each second heat dissipating fin has at least one communicating structure, the communicating structure of each first heat dissipating fin is adapted to communicate with two adjacent second heat dissipating groove assemblies of each second heat dissipating fin, the communicating structure of each second heat dissipating fin is adapted to communicate with two adjacent first heat dissipating groove assemblies of each first heat dissipating fin.

In one embodiment of the present invention, wherein the first heat dissipating groove units of one first heat dissipating groove assembly and the first heat dissipating groove units of another first heat dissipating groove assembly adjacent thereto are interlaced with each other respectively, and the second heat dissipating groove units of one second heat dissipating groove assembly and the second heat dissipating groove units of another second heat dissipating groove assembly adjacent thereto are interlaced with each other respectively.

In one embodiment of the present invention, wherein the communicating structure of each first heat dissipating fin is further communicated with two second heat dissipating groove units of the second heat dissipating fin adjacent to first heat dissipating fin, and the two second heat dissipating groove units are adjacent and arranged along the first direction or the second direction, and the communicating structure of each second heat dissipating fin is further communicated with two first heat dissipating groove units of the first heat dissipating fin adjacent to the second heat dissipating fin, and the two first heat dissipating groove units are adjacent and arranged along the first direction or the second direction.

In one embodiment of the present invention, wherein each first heat dissipating fin and each second heat dissipating fin have a inlet guiding groove and a outlet guiding groove respectively, the inlet guiding grooves are formed to be the inlet channel, the outlet guiding grooves are formed to be the outlet channel.

In one embodiment of the present invention, the heat dissipating module further comprises a inlet joint and a outlet joint, and the first body of partial of the first heat dissipating fins and the second body of partial of the second heat dissipating fins have a inlet concave and a outlet concave, the inlet concaves are formed to be a inlet connecting space, the outlet concaves are formed to be a outlet connecting space, one side of the inlet connecting space is communicated with the inlet joint, another side of the inlet connecting space is communicated with the inlet channel, one side of the outlet connecting space is communicated with the outlet joint, another side of the outlet connecting space is communicated with the outlet channel.

In one embodiment of the present invention, wherein each inlet concave is communicated with the corresponding inlet guiding groove, each outlet concave is communicated with the corresponding outlet guiding groove.

In one embodiment of the present invention, wherein the combination of the first heat dissipating fins and the second heat dissipating fins is fabricated on the heat source along the first direction, and the inlet channel is communicated with the end portion of the first heat dissipating groove assembly adjacent to the heat source or the end portion of the second heat dissipating groove assembly adjacent to the heat source, the outlet channel is communicated with the end portion of the first heat dissipating groove assembly away from the heat source or the end portion of the second heat dissipating groove assembly away from the heat source.

In one embodiment of the present invention, wherein the first heat dissipating groove assemblies and the second heat dissipating groove assemblies are corresponding with each other, and a distance between each first heat dissipating groove assembly and the heat source is equal to a distance between the second heat dissipating groove assemblies corresponding to the first heat dissipating groove assembly and the heat source substantially.

In one embodiment of the present invention, the heat dissipating module further comprises a third heat dissipating fin, disposed in two sides of the combination of the first heat dissipating fins and the second heat dissipating fins.

In one embodiment of the present invention, wherein each first heat dissipating groove unit and each second heat dissipating groove unit are a strip-shape structure, a diamond structure, a round-shape structure, or a triangular structure.

In one embodiment of the present invention, wherein the first heat dissipating groove units and the second heat dissipating groove units are interlaced with each other.

In one embodiment of the present invention, wherein a projection area of one first heat dissipating groove assembly of the first heat dissipating fin onto the heat source is overlapped with a projection area of another first heat dissipating groove assembly of the first heat dissipating fin onto the heat source, a projection area of one second heat dissipating groove assembly of the second heat dissipating fin onto the heat source is overlapped with a projection area of another second heat dissipating groove assembly of the second heat dissipating fin onto the heat source.

In one embodiment of the present invention, wherein a overlapping area between the first heat dissipating groove unit and the second heat dissipating groove unit is smaller than 30% area of the first heat dissipating groove unit or 30% area of the second heat dissipating groove unit.

In one embodiment of the present invention, wherein the fabricating direction is not vertical to a top surface of the heat source, and is parallel to the top surface of the heat source.

As described in the embodiments of the invention, a plurality of the heat dissipating groove units are configured in at least two heat dissipating fins respectively. The heat dissipating groove units in each heat dissipating fin are not communicated with each other. The heat dissipating groove unit of one heat dissipating fin is communicated with the adjacent heat dissipating groove unit of the heat dissipating fin by a heat dissipating groove unit of another heat dissipating fin when the heat dissipating fins are combined. Therefore, a heat dissipating channel is configured by the heat dissipating groove units of the all heat dissipating fins to heat dissipate for the heat source when the all heat dissipating fins are combined with each other.

Other features and advantages of the invention will be further understood from the further technological features disclosed by the embodiments of the invention wherein there are shown and described embodiments of this invention, simply by way of illustration of best modes to carry out the invention.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

Other features and advantages of the invention will be further understood from the further technological features disclosed by the embodiments of the invention wherein there are shown and described embodiments of this invention, simply by way of illustration of best modes to carry out the invention.

Figure 1:
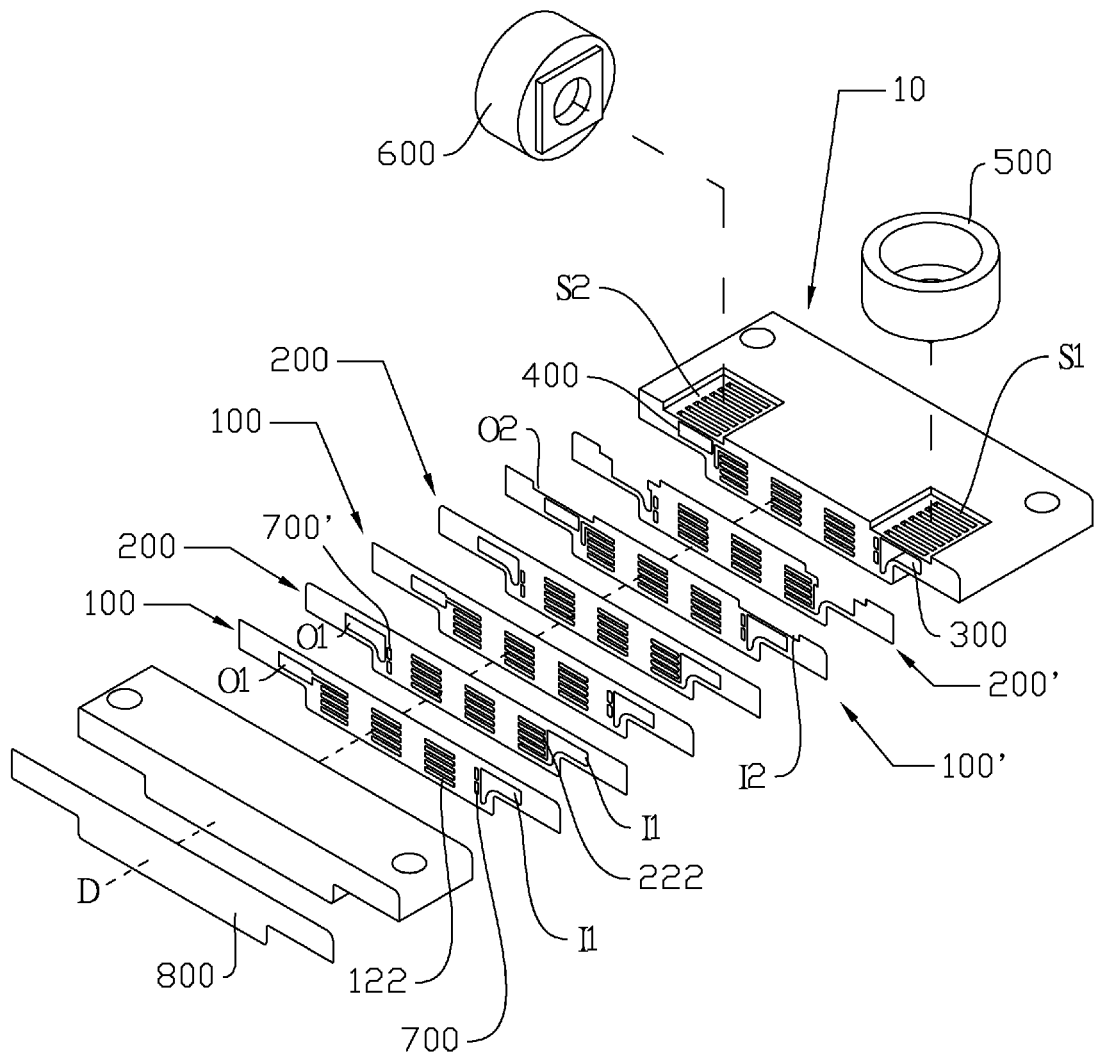
FIG. 1 a schematic view illustrating the heat dissipating module according to one embodiment of the present invention.
Figure 2A:
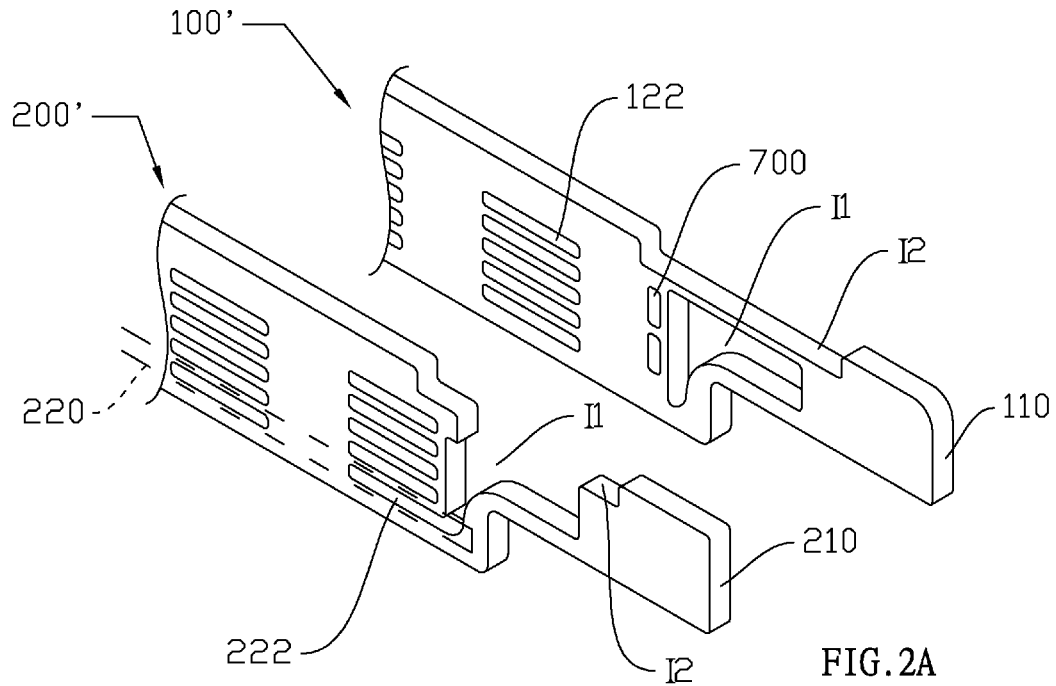
FIG. 2A and FIG. 2B are schematic views illustrating partial of the heat dissipating fins of the heat dissipating module depicted in FIG. 1.
Figure 2B:
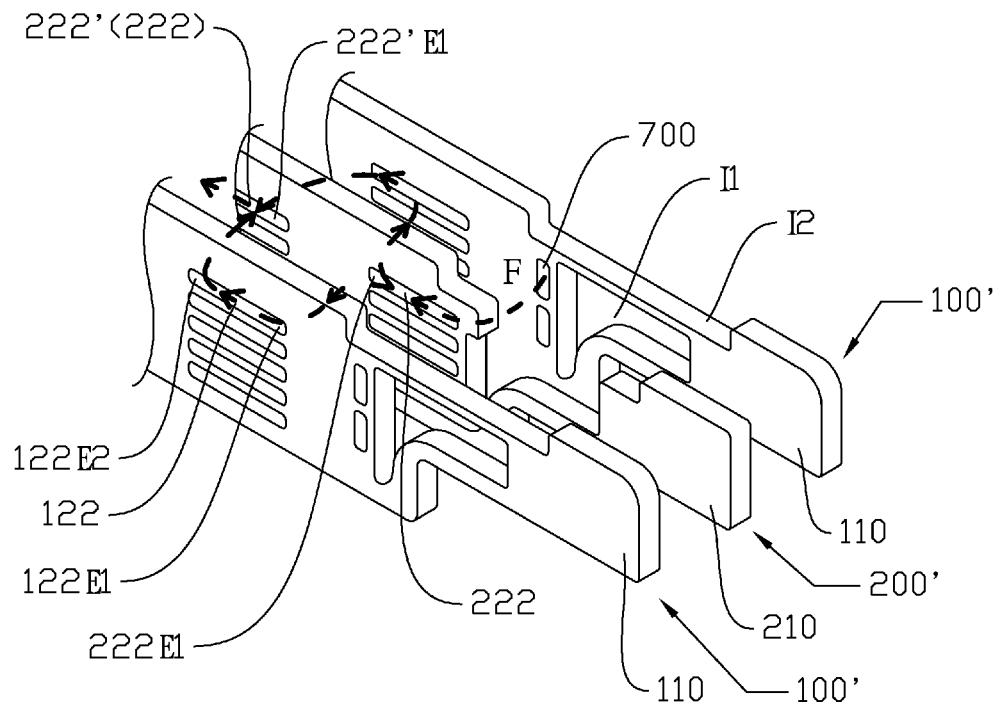
Figure 3:
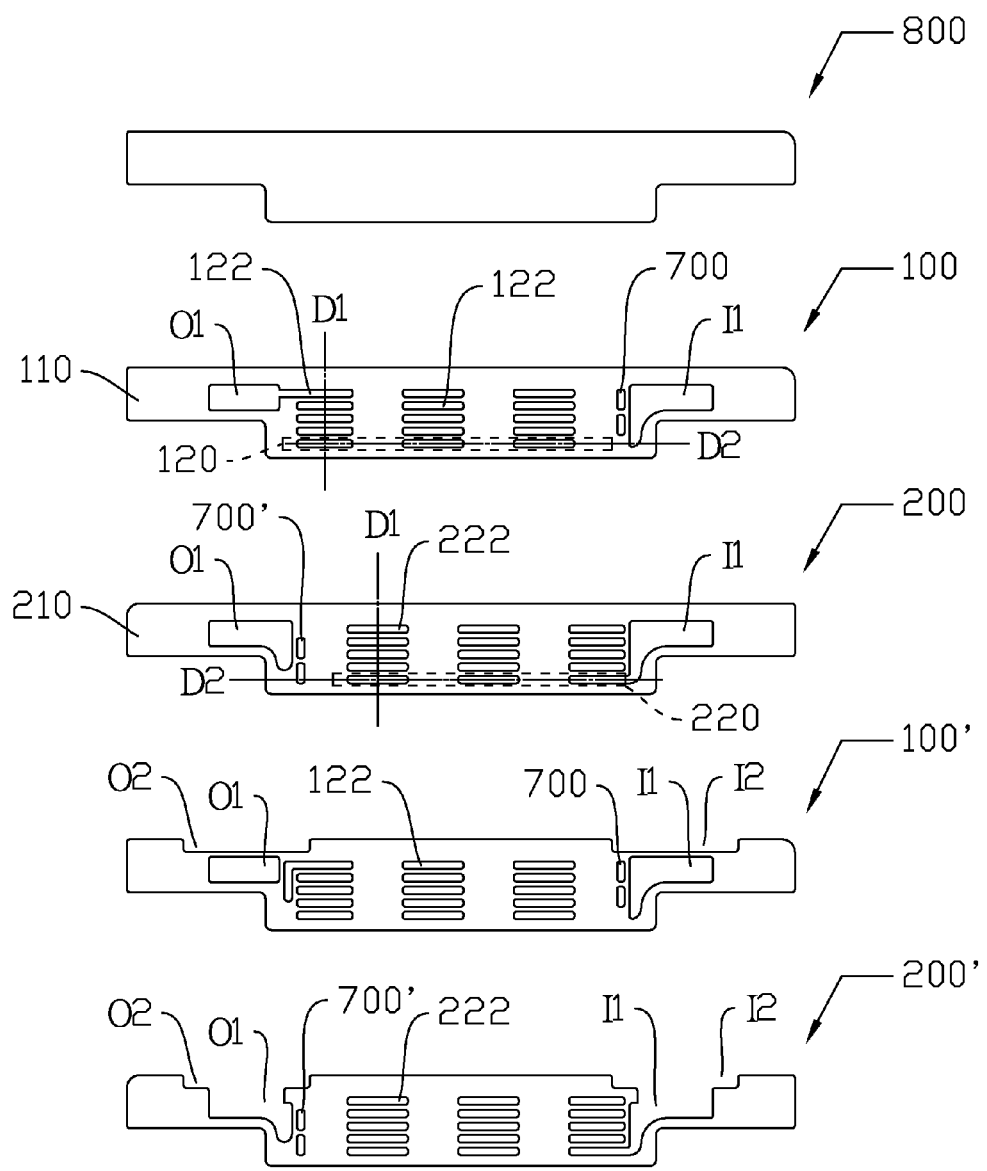
FIG. 3 is a cross sectional view illustrating partial of the heat dissipating fins depicted in FIG. 1.
Figure 4:
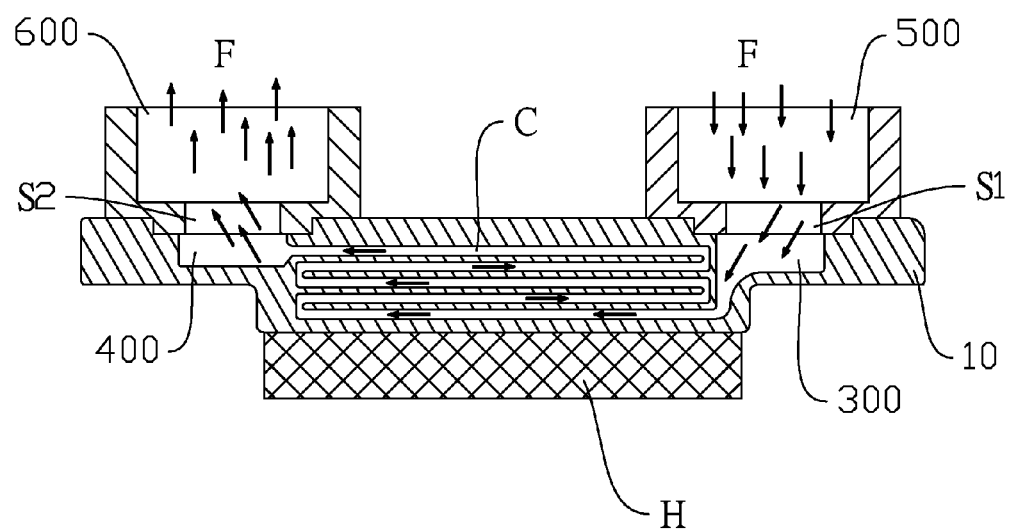
FIG. 4 is a cross sectional view illustrating the heat dissipating module depicted in FIG. 1.

FIG. 1 a schematic view illustrating the heat dissipating module according to one embodiment of the present invention, FIG. 2A and FIG. 2B are schematic views illustrating partial of the heat dissipating fins of the heat dissipating module depicted in FIG. 1, FIG. 3 is a cross sectional view illustrating partial of the heat dissipating fins depicted in FIG. 1, and FIG. 4 is a cross sectional view illustrating the heat dissipating module depicted in FIG. 1. Please refer to FIG. 1, FIG. 2A, FIG. 2B, FIG. 3, and FIG. 4, a heat dissipating module 10 of the embodiment is adapted to heat dissipate for a heat source H, the heat dissipating module 10 includes a plurality of first heat dissipating fins 100 and 100' and a plurality of second heat dissipating fins 200 and 200', the first heat dissipating fins 100/100' and the second heat dissipating fins 200/200' are, for example, combined with each other along a fabricating direction D. For example, the first heat dissipating fins 100/100' and the second heat dissipating fins 200/200' can be formed to a block by a compressing technology to be the heat dissipating module 10 of the invention.

As mentioned above, each first heat dissipating fin 100/100' has a first body 110 and a plurality of first heat dissipating groove assemblies 120, the first heat dissipating groove assemblies 120 area arranged in the first body 110 along a the first direction D1. In addition, each first heat dissipating groove assembly 120 has a plurality of first heat dissipating groove units 122, the first heat dissipating groove units 122 are arranged in the first body 110 along a the second direction D2. The heat dissipating module 10 of the embodiment is, for example, fabricated on the heat source H along the first direction D1 to heat dissipate for the heat source H. The first direction D1 and the second direction D2 are, for example, vertical with each other, and the fabricating direction D is vertical to the first direction D1 and the second direction D2 respectively. Similarly, each second heat dissipating fin 200/200' has a second body 210 and a plurality of second heat dissipating groove assemblies 220 arranged in the second body 210 along the first direction D1, each second heat dissipating groove assembly 220 has a plurality of second heat dissipating groove units 222 arranged in the second body 210 along the second direction D2.

In one embodiment of the present invention, wherein a projection area of one first heat dissipating groove assembly 120 of the first heat dissipating fin 100/100' onto the heat source is H overlapped with a projection area of another first heat dissipating groove assembly 120 of the first heat dissipating fin 100/100' onto the heat source H, a projection area of one second heat dissipating groove assembly 220 of the second heat dissipating fin 200/200' onto the heat source H is overlapped with a projection area of another second heat dissipating groove assembly 220 of the second heat dissipating fin 200/200' onto the heat source H. A overlapping area between the first heat dissipating groove unit 122 and the second heat dissipating groove unit 222 is smaller than 30% area of the first heat dissipating groove unit 122 or 30% area of the second heat dissipating groove unit 222. The fabricating direction D is not vertical to a top surface of the heat source H, and is parallel to the top surface of the heat source H.

The first heat dissipating groove assemblies 120 and the second heat dissipating groove assemblies 220 are corresponding with each other and configured in the first heat dissipating fins 100/100' and the second heat dissipating fins 200/200' respectively. The distance between each first heat dissipating groove assembly 120 and the heat source H is substantially equal to the distance between the corresponding second heat dissipating groove assembly 220 and the heat source H, such as the first heat dissipating groove assemblies 120 can be communicated to the corresponding second heat dissipating groove assemblies 220. Furthermore, the first heat dissipating fins 100/100' and the second heat dissipating fins 200/200' can be, for example, formed to a block by a compressing technology. The heat dissipating groove units of the first heat dissipating fins 100/100' and the second heat dissipating fins 200/200' are interlaced with each other to allow the heat dissipating groove units to configure a series connection form or a parallel connection form, and a working fluid F is restricted within a channel configured by the communication of the heat dissipating groove units. About the detail design of the first heat dissipating fins 100/100' and the second heat dissipating fins 200/200', the embodiment will describe as following.

In the heat dissipating module 10 of the embodiment, each first heat dissipating fin 100/100' and each second heat dissipating fin 200/200' have a inlet guiding groove I1 and a outlet guiding groove O1 respectively. When the first heat dissipating fins 100/100' and the second heat dissipating fins 200/200' are combined with each other, the inlet guiding grooves I1 of the first heat dissipating fins 100/100' and the second heat dissipating fins 200/200' are form to be a inlet channel 300, and the outlet guiding grooves O1 of the first heat dissipating fins 100/100' and the second heat dissipating fins 200/200' are form to be a outlet channel 400. Besides, the heat dissipating module 10 further comprises a inlet joint 500 and a outlet joint 600, and the first body 110 of partial of the first heat dissipating fins 100' and the second body 210 of partial of the second heat dissipating fins 200' have a inlet concave I2 and a outlet concave O2.

Similarly, when the first heat dissipating fins 100/100' and the second heat dissipating fins 200/200' are combined with each other, the inlet concaves I2 are formed to be a inlet connecting space S1, the outlet concaves O2 are formed to be a outlet connecting space S2. One side of the inlet connecting space S1 is communicated to the inlet joint 500, and another side of the inlet connecting space S1 is communicated to the inlet channel 300. One side of the outlet connecting space S2 is communicated to the outlet joint 600, and another side of the outlet connecting space S2 is communicated to the outlet channel 400. Each inlet concave I2 is, for example, communicated with the corresponding inlet guiding groove I1, and each outlet concave O2 is, for example, communicated with the corresponding outlet guiding groove O1. Therefore, when the working fluid F flows into the inlet joint 500, the working fluid F can transmit to the inlet channel 300 through the inlet connecting space S1 smoothly, and then the working fluid F flows through the outlet channel 400 and the outlet connecting space S2. Finally, the working fluid F flows out of the heat dissipating module 10 from the outlet joint 600.

Each first heat dissipating groove assembly 120 and each second heat dissipating groove assembly 220 have two end portions respectively, the inlet channel 300 and the outlet channel 400 are adapted to communicate with two of these end portions respectively. As shown in FIG. 2A and FIG. 3, the second heat dissipating groove unit 222 disposed in one end portion of the second heat dissipating groove assembly 220 of the second heat dissipating fin 200/200' is communicated with the inlet guiding groove I1. Similarly, the first heat dissipating groove unit 122 disposed in one end portion of the first heat dissipating groove assembly 120 of the first heat dissipating fin 100/100' is communicated with the outlet guiding groove O1 by the same design.

Furthermore, in the embodiment, a communicating structure 700/700' is configure in the first heat dissipating fin 100/100' or the second heat dissipating fin 200/200' to make two adjacent heat dissipating groove assemblies arranged along the first direction D1 communicate with each other, allowing the working fluid F to flow into the heat dissipating module 10 from the inlet joint 500, and flow out of the heat dissipating module 10 from the outlet joint 600 smoothly. That is to say, when the communicating structure 700 is configure in the first heat dissipating fins 100/100', two adjacent second heat dissipating groove assemblies 220 of the second heat dissipating fin 200/200' combined with the first heat dissipating fin 100/100' are communicated with each other by the assistance of the communicating structure 700. Similarly, when the communicating structure 700' is configure in the second heat dissipating fins 200/200', two adjacent first heat dissipating groove assemblies 120 of the first heat dissipating fin 100/100' combined with the second heat dissipating fin 200/200' are communicated with each other by the assistance of the communicating structure 700'.

Specially, when the first heat dissipating fins 100/100' and the second heat dissipating fins 200/200' are combined with each other, one end 122E1 of the first heat dissipating groove unit 122 of each first heat dissipating fin 100' and one end 222E1 of the second heat dissipating groove unit 222 of the second heat dissipating fin 200' adjacent to the first heat dissipating fin 100' are overlapped, and another end 122E2 of the first heat dissipating groove unit 122 and one end 222'E1 of another second heat dissipating groove unit 222'(222) are overlapped (as shown in FIG. 2B and FIG. 3). The second heat dissipating groove unit 222 and the second heat dissipating groove unit 222'(222) overlapped with the first heat dissipating groove unit 122 are adjacent and arranged in the second body 210 along the second direction D2. That is to say, although the second heat dissipating groove unit 222 and the second heat dissipating groove unit 222'(222) of the second heat dissipating fin 200/200' are not communicated, but the second heat dissipating groove unit 222 and the second heat dissipating groove unit 222'(222) adjacent to the second heat dissipating groove unit 222 can be communicated by the assistance of one first heat dissipating groove unit 122 when the first heat dissipating fins 100/100' and the second heat dissipating fins 200/200' are combined, wherein the second heat dissipating groove unit 222 and the second heat dissipating groove unit 222'(222) are arranged along the second direction D2. The above description takes an example of the communication of a plurality of second heat dissipating groove units 222 by the assistance of one first heat dissipating groove unit 122. Similarly, a plurality of first heat dissipating groove units 122 also can be communicated by the assistance of one second heat dissipating groove unit 222.

As such, two adjacent heat dissipating groove units of one heat dissipating fin can be communicated by the assistance of one heat dissipating groove unit of another heat dissipating fin, and two adjacent heat dissipating groove assemblies of one heat dissipating fin also can be communicated by the assistance of the communicating structure of another heat dissipating fin. The embodiment allows the heat dissipating groove units to communicate with each other along the first direction D1 or the second direction D2 when the first heat dissipating fins 100/100' and the second heat dissipating fins 200/200' are combined. That is to say, the inlet channel 300, the first heat dissipating groove assemblies 120 and the second heat dissipating groove assemblies 220 multi-layered within the heat dissipating module 10, and the outlet channel 400 can form to a heat dissipating channel C, allowing to heat dissipate for the heat source H. Then, the working fluid F can flow into the heat dissipating module 10 from the inlet joint 500, and flow out of the heat dissipating module 10 from the outlet joint 600.

Worth mentioning is that the inlet channel 300 is, for example, communicated with one end portion of the first heat dissipating groove assembly 120 or the second heat dissipating groove assembly 220 close to the heat source H. The outlet channel 400 is, for example, communicated with one end portion of the first heat dissipating groove assembly 120 or the second heat dissipating groove assembly 220 away from the heat source H. In detail, in order to make the heat dissipating module 10 have a preferred heat dissipating efficiency, the inlet channel 300 is communicated with the heat dissipating groove assembly closed to the bottom of the heat dissipating module 10 in the embodiment. Therefore, heat of the bottom of the heat dissipating module 10 transferred from the heat source H can be removed effectively and directly by the working fluid F having the lower temperature, and the working fluid F with the heat be transmitted to the top of the heat dissipating module 10 through the communicated heat dissipating groove assemblies. The heat dissipation can be performed by the assistance of a nature convection or a forcing convection generated by a fan disposed on the top of the heat dissipating module 10. Therefore, when the heat generated from the heat source H be transmitted to the top of the heat dissipating module 10 with the working fluid F, the heat generated from the heat source H can be removed by the assistance of the nature convection, the forcing convection, or other suitable methods, allowing to decrease the temperature of the working fluid F. Naturally, the working fluid F also can flow out of the heat dissipating module 10 from the outlet joint 600, and process suitable heat removing assignments between the heat dissipating module 10 and the environment, then flow into the heat dissipating module 10 again from the inlet joint 500.

Besides, in the embodiment, one end portion of the first heat dissipating groove unit 122 and one end portion of the second heat dissipating groove unit 222 are, for example, overlapped partially. The following will be described with FIG. 2B. When one end portion of the first heat dissipating groove unit 122 and one end portion of the second heat dissipating groove unit 222 are overlapped partially and the working fluid F flows into the first heat dissipating groove unit 122, the working fluid F be separated by the inner wall of the first heat dissipating groove unit 122 and then flows into two second heat dissipating groove units 222 overlapped with the first heat dissipating groove unit 122 partially. Similarly, when the working fluid F flows into the second heat dissipating groove unit 222, the working fluid F also be separated by the inner wall of the second heat dissipating groove unit and then flows into two first heat dissipating groove unit 122 overlapped with the second heat dissipating groove unit 222 partially. Naturally, when the working fluid F be separated and flows into the two second heat dissipating groove units 222, the working fluid F come across the inner wall thereof and be separated again. The separated working fluid F will be conflux to the first heat dissipating groove unit 122 overlapped partially with the two second heat dissipating groove units 222. Similarly, when the working fluid F be separated and flows into the two first heat dissipating groove units 122, the working fluid F come across the inner wall thereof and be separated again. The separated working fluid F will be conflux to the second heat dissipating groove unit 222 overlapped partially with the two first heat dissipating groove units 122. That is to say, when the working fluid F flows pass each heat dissipating groove unit, the working fluid F will be separated or conflux continuously. In a process of the working fluid F flowing through a plurality of first heat dissipating groove assemblies 120 and second heat dissipating groove assemblies 220 multi-layered in the heat dissipating module 10, the working fluid F have larger contacting area with each first body 110 and each second body 210. Then, a heat exchange among the heat dissipating groove units, the first body 110, and the second body 210 can be performed, allowing to remove the heat transmitted from the heat source H to the heat dissipating fins.

Furthermore, in the heat dissipating module 10 of the embodiment, the working fluid F collides with the inner wall of the end portion of each heat dissipating groove unit to generate a turbulence flow when the working fluid F flow through the heat dissipating groove units interlaced with each other, and then the working fluid F is separated into the heat dissipating groove units adjacent to the foregoing heat dissipating groove unit. The above design can make the temperature of the working fluid F within one region is uniform, allowing to heat exchange stably.

In addition, the heat dissipating module 10 of the embodiment further comprises at least two third heat dissipating fins 800, each third heat dissipating fin 800 just is a board having no holes or crack. Each third heat dissipating fin 800 is disposed in two sides of the combination of the first heat dissipating fins 100 and the second heat dissipating fins 200 to make the heat dissipating module 10 have a closed-type body, allowing to have a more complete design of the heat dissipating channel C.

Figure 5:
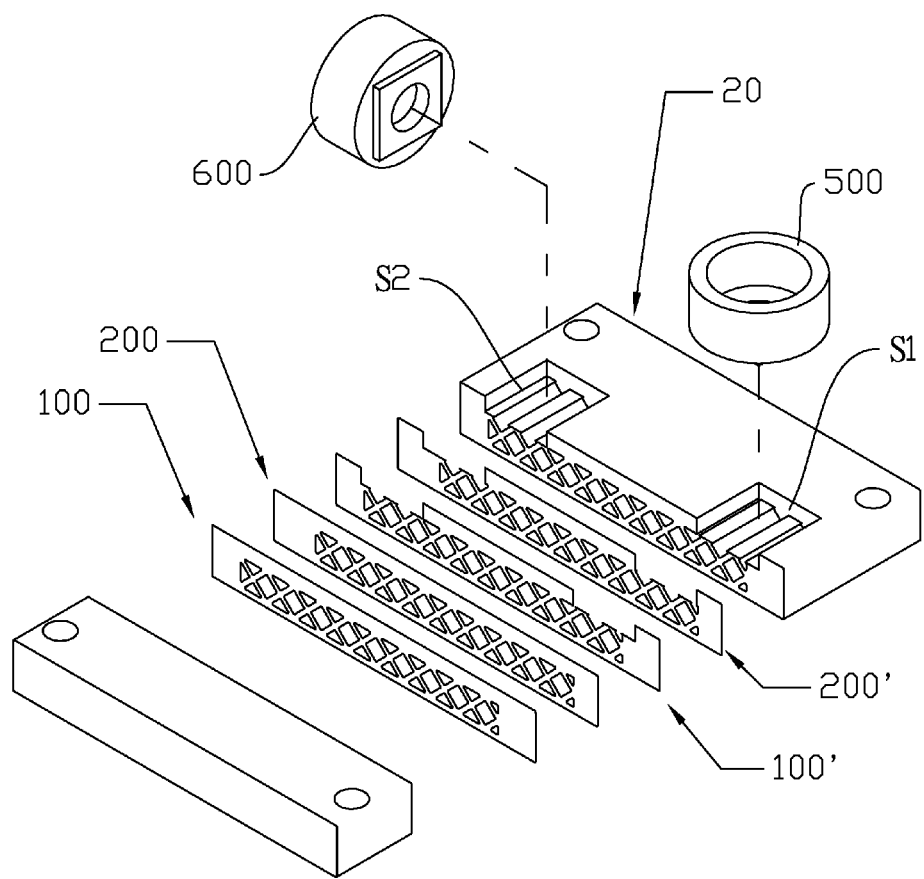
FIG. 5 a schematic view illustrating the heat dissipating module according to another embodiment of the present invention.
Figure 6A:
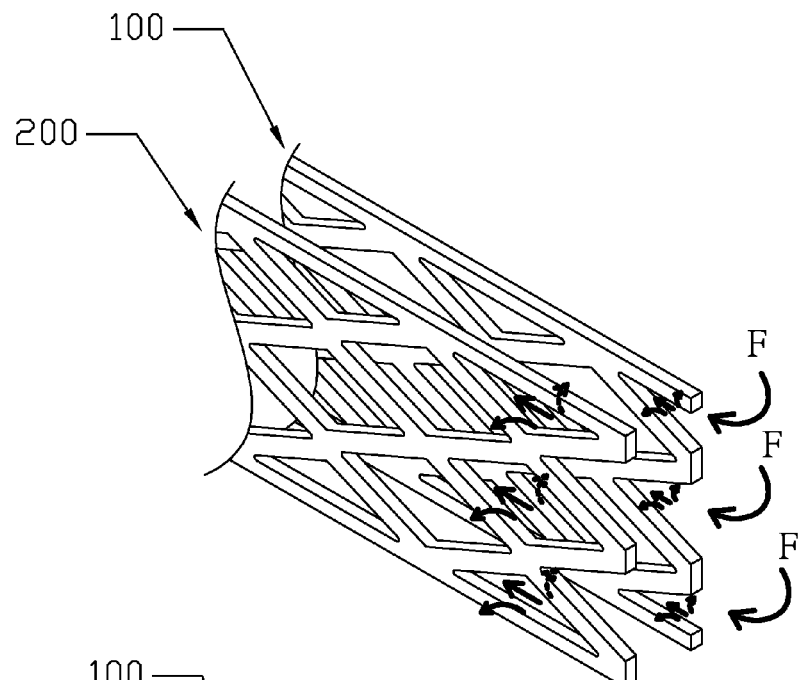
FIG. 6A and FIG. 6B are schematic views illustrating partial of the heat dissipating fins of the heat dissipating module depicted in FIG. 5.
Figure 6B:
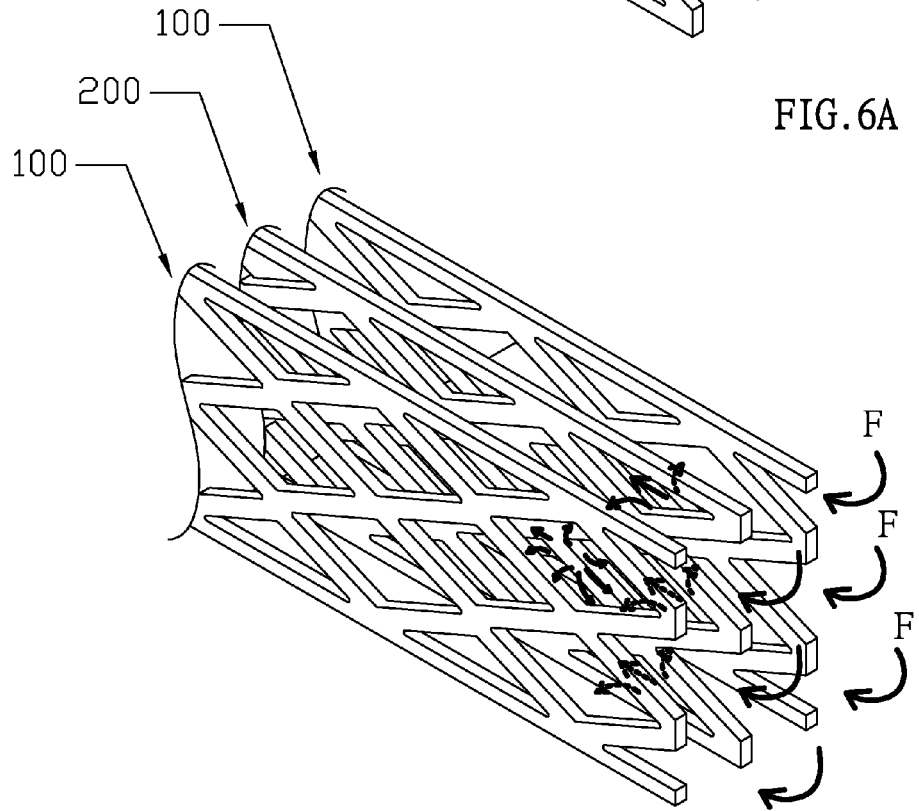
Figure 7A:
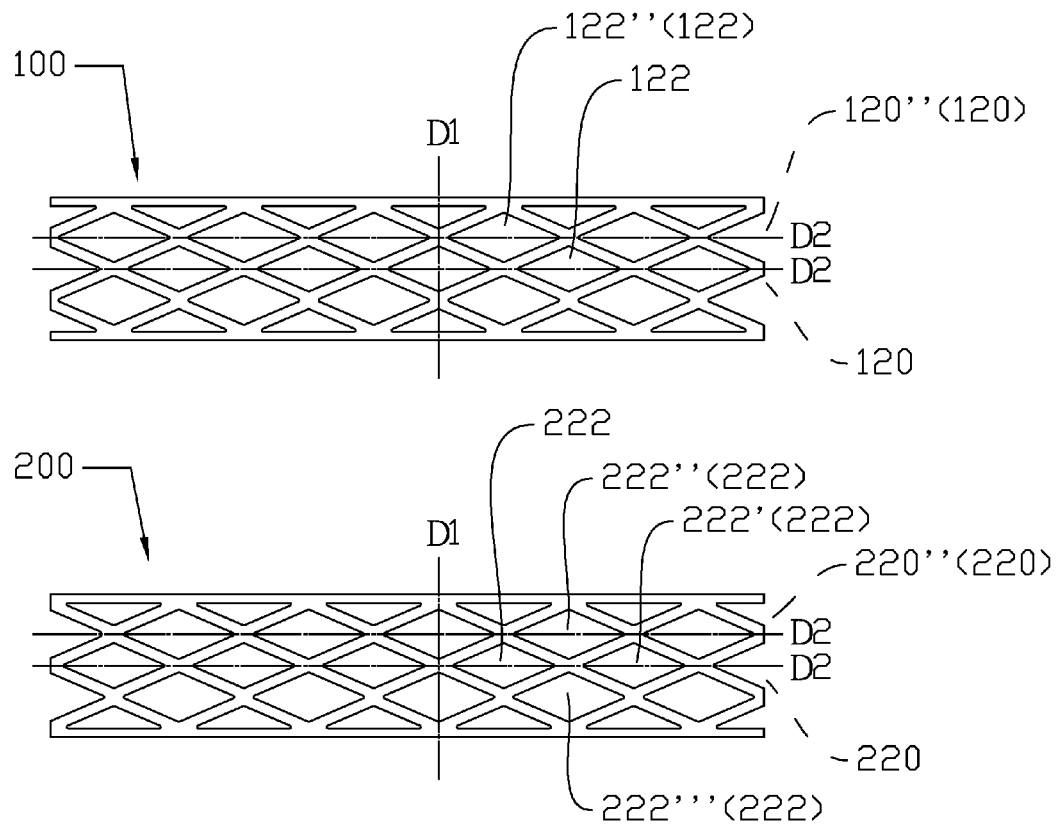
FIG. 7A is a cross sectional view illustrating partial of the heat dissipating fins of the heat dissipating module depicted in FIG. 5.
Figure 7B:
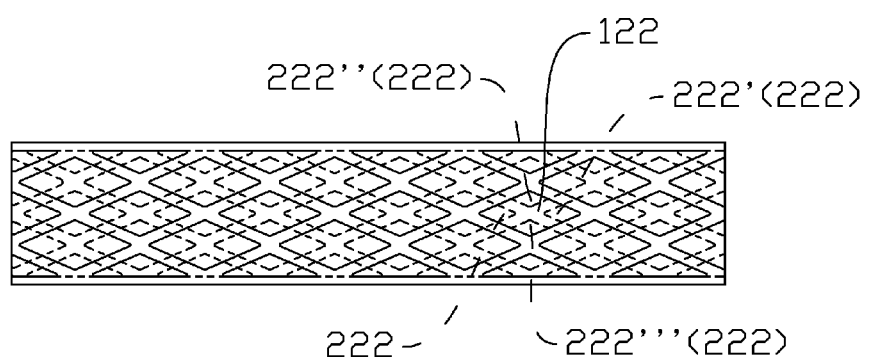
FIG. 7B is a schematic view illustrating a stack of the heat dissipating fins depicted in FIG. 7A.

FIG. 5 a schematic view illustrating the heat dissipating module according to another embodiment of the present invention. FIG. 6A and FIG. 6B are schematic views illustrating partial of the heat dissipating fins of the heat dissipating module depicted in FIG. 5. FIG. 7A is a cross sectional view illustrating partial of the heat dissipating fins of the heat dissipating module depicted in FIG. 5. FIG. 7B is a schematic view illustrating a stack of the heat dissipating fins depicted in FIG. 7A. Please refer to FIG. 5, FIG. 6A, FIG. 6B, FIG. 7A and FIG. 7B, the heat dissipating module 20 of this embodiment is similar to the heat dissipating module 10 of the above embodiment. The main difference between the heat dissipating module 20 and the heat dissipating module 10 is that each heat dissipating groove unit of the heat dissipating module 10 in above embodiment is strip-shape structure, and each heat dissipating groove unit of the heat dissipating module 20 in this embodiment is a diamond structure.

In the embodiment of the heat dissipating groove unit being a diamond structure, the first heat dissipating groove units 122 of each first heat dissipating groove assembly 120 (a diamond structure arrange extended along the second direction D2 is, for example, shown in FIG. 7A) and the first heat dissipating groove units 122" (122) of another first heat dissipating groove assembly 120" (120) adjacent to the foregoing first heat dissipating groove assembly 120 are interlaced respectively. The second heat dissipating groove units 222 of the second heat dissipating groove assembly 220 and the second heat dissipating groove units 222" (222) of another second heat dissipating groove assembly 220" are interlaced respectively. Besides, the communicating structure of this embodiment is integrated with each heat dissipating groove unit. In detail, due to the heat dissipating groove unit is a diamond structure in the embodiment and two presuppositions (described as following), the two adjacent second heat dissipating groove units (the second heat dissipating groove unit 222 and the second heat dissipating groove unit 222' (222)) arranged along the second direction D2 are communicated with each other by the assistance of the first heat dissipating groove unit 122. Similarly, the two adjacent second heat dissipating groove units (the second heat dissipating groove unit 222"(222) and the second heat dissipating groove unit 222'"(222)) arranged along the first direction D1 are communicated with each other by the assistance of each first heat dissipating groove unit 122. That is to say, the two adjacent second heat dissipating assemblies can be communicated by the assistance of each first heat dissipating groove unit 122. In other word, when the first heat dissipating fin 100 and the second heat dissipating fin 200 as shown in FIG. 7A are combined, the communicating structure integrated with each heat dissipating groove unit of one of the first heat dissipating fin 100 and the second heat dissipating fin 200 can assist the communication among the heat dissipating groove units of the other of the first heat dissipating fin 100 and the second heat dissipating fin 200, wherein the above design is shown in FIG. 7B. Herein, one of the above presuppositions is: the heat dissipating groove units of one heat dissipating groove assembly are interlaced with the heat dissipating groove units of another heat dissipating groove assembly adjacent to the foregoing heat dissipating groove assembly. The other of the above presuppositions is: one end portion of the first heat dissipating groove unit 122 is overlapped partially with one end portion of the second heat dissipating groove unit 222.

Similar to the above embodiment, when the working fluid F flows pass the end portion of the heat dissipating groove units interlaced with each other, the working fluid F will collide with the inner wall of the end portion of each heat dissipating groove unit, and generates a turbulence flow in the embodiment. Then, the working fluid F will be separated into other heat dissipating groove units adjacent to the foregoing heat dissipating groove unit. Worth mentioning is that due to the heat dissipating groove unit is a diamond structure in the embodiment, at least an inclined plane is configure in the inner wall of the heat dissipating groove unit. Therefore, when the working fluid F collide with the inner wall of the end portion of each heat dissipating groove unit, the working fluid F will be separated and flows toward multi-directions. This design is permit to form a turbulence flow with larger degree, and make the temperature of the working fluid F within one region is uniform, allowing to heat exchange stably.

The above description takes an example of the communication of a plurality of second heat dissipating groove units 222 by the assistance of one first heat dissipating groove unit 122. Naturally, a plurality of first heat dissipating groove units 122 also can be communicated with each other by the assistance of one second heat dissipating groove unit 222. In addition to the heat dissipating groove unit of the invention can be the strip-shape structure and the diamond structure described like above embodiments, the heat dissipating groove unit of the invention also can be a round-shape structure, a triangular structure or other suitable structures, including but not limited to these shapes.

As described in the embodiments of the invention, the heat dissipating groove units are configured in at least two heat dissipating fins respectively, wherein the heat dissipating groove units of each heat dissipating fin are not communicated with each other. When these heat dissipating fins are combined, the heat dissipating groove unit of one heat dissipating fin can be communicated with another heat dissipating groove unit of the foregoing heat dissipating fin by the assistance of one heat dissipating groove unit of another heat dissipating fin. Therefore, these heat dissipating groove units configured within the heat dissipating module densely can form a heat dissipating channel C having a preferred heat dissipating efficiency, allowing to heat dissipate for the heat source effectively.

In addition, through two interlaced heat dissipating groove units disposed in two adjacent heat dissipating fins respectively, various shapes of the heat dissipating groove units, a plurality of the heat dissipating groove units communicated with each other and disposed within heat dissipating module by multi-layers configured method, the invention can increase the contacting area between the working fluid and the heat dissipating module substantially, and make the working fluid with a turbulence flow through the heat dissipating groove units interlaced with each other to have a uniform heat exchange between the heat dissipating module and the working fluid stably.

Although the invention has been described with reference to the above embodiments, it will be apparent to one of the ordinary skill in the art that modifications to the described embodiments may be made without departing from the spirit of the invention. Accordingly, the scope of the invention will be defined by the attached claims rather than by the above detailed descriptions.

What is claimed is:
1. A heat dissipating module, adapt to heat dissipate for a heat source, the heat dissipating module comprising:
  a plurality of first heat dissipating fins, each first heat dissipating fin has a first body and a plurality of first heat dissipating groove assemblies arranged in the first body along a first direction, each first heat dissipating groove assembly has a plurality of first heat dissipating grooves unit arranged in the first body along a second direction, the first heat dissipating grooves unit of each first heat dissipating fin are without overlap; and a plurality of second heat dissipating fins, each second heat dissipating fin has a second body and a plurality of second heat dissipating groove assemblies arranged in the second body along the first direction, each second heat dissipating groove assembly has a plurality of second heat dissipating groove units arranged in the second body along the second direction, the second heat dissipating grooves unit of each second heat dissipating fin are without overlap;

wherein the first heat dissipating fins and the second heat dissipating fins are combined with each other, one end of the first heat dissipating groove unit of each first heat dissipating fin is overlapped with one end of one second heat dissipating groove unit of one second heat dissipating fin adjacent to the first heat dissipating fin, another end of the first heat dissipating groove unit is overlapped with one end of another second heat dissipating groove unit, and the two second heat dissipating groove units overlapped with the first heat dissipating groove unit are adjacent and arranged in the second body along the second direction, wherein each first heat dissipating groove assembly and each second heat dissipating groove assembly have two end portions respectively, and two of the end portions are communicated with an inlet channel and an outlet channel respectively;

wherein the first body of each first heat dissipating fin has a first heat contacting side, and the second body of each second heat dissipating fin has a second heat contacting side;

wherein when the first heat dissipating fins and the second heat dissipating fins are combined with each other, a heat contacting surface be constructed by these first heat contacting sides and these second heat contacting sides for contacting to the heat source;

wherein each first heat dissipating groove unit is constructed by inclined inner walls completely, and each second heat dissipating groove unit is constructed by inclined inner walls completely;

wherein an included angle between the inclined inner wall and the heat contacting surface is acute angle or obtuse angle;

wherein one end portion of the first heat dissipating groove unit is partial overlapped with one end portion of the second heat dissipating groove unit;

wherein at least one of each first heat dissipating fin and each second heat dissipating fin has at least one communicating structure, the communicating structure of each first heat dissipating fin is adapted to communicate with two adjacent second heat dissipating groove assemblies of each second heat dissipating fin, the communicating structure of each second heat dissipating fin is adapted to communicate with two adjacent first heat dissipating groove assemblies of each first heat dissipating fin; and wherein the first heat dissipating groove units of one first heat dissipating groove assembly and the first heat dissipating groove units of another first heat dissipating groove assembly adjacent thereto are interlaced with each other respectively, and the second heat dissipating groove units of one second heat dissipating groove assembly and the second heat dissipating groove units of another second heat dissipating groove assembly adjacent thereto are interlaced with each other respectively.

2. The heat dissipating module as recited in claim 1, wherein the first heat dissipating fins are combined with the second heat dissipating fins along a fabricating direction with each other, and the first direction, the second direction, and the fabricating direction are vertical with each other.

3. The heat dissipating module as recited in claim 1, wherein the inlet channel, the first heat dissipating groove assemblies, the second heat dissipating groove assemblies, and the outlet channel are communicated with each other to form a heat dissipating channel.

4. The heat dissipating module as recited in claim 1, wherein the communicating structure of each first heat dissipating fin is further communicated with two second heat dissipating groove units of the second heat dissipating fin adjacent to first heat dissipating fin, and the two second heat dissipating groove units are adjacent and arranged along the first direction or the second direction, and the communicating structure of each second heat dissipating fin is further communicated with two first heat dissipating groove units of the first heat dissipating fin adjacent to the second heat dissipating fin, and the two first heat dissipating groove units are adjacent and arranged along the first direction or the second direction.

5. The heat dissipating module as recited in claim 1, wherein each first heat dissipating fin and each second heat dissipating fin have an inlet guiding groove and an outlet guiding groove respectively, the inlet guiding grooves are formed to be the inlet channel, the outlet guiding grooves are formed to be the outlet channel.

6. The heat dissipating module as recited in claim 5, further comprises an inlet joint and an outlet joint, and the first body of partial of the first heat dissipating fins and the second body of partial of the second heat dissipating fins have an inlet concave and an outlet concave, the inlet concaves are formed to be an inlet connecting space, the outlet concaves are formed to be an outlet connecting space, one side of the inlet connecting space is communicated with the inlet joint, another side of the inlet connecting space is communicated with the inlet channel, one side of the outlet connecting space is communicated with the outlet joint, another side of the outlet connecting space is communicated with the outlet channel.

7. The heat dissipating module as recited in claim 6, wherein each inlet concave is communicated with the corresponding inlet guiding groove, each outlet concave is communicated with the corresponding outlet guiding groove.

8. The heat dissipating module as recited in claim 1, wherein the combination of the first heat dissipating fins and the second heat dissipating fins is fabricated on the heat source along the first direction, and the inlet channel is communicated with the end portion of the first heat dissipating groove assembly adjacent to the heat source or the end portion of the second heat dissipating groove assembly adjacent to the heat source, the outlet channel is communicated with the end portion of the first heat dissipating groove assembly away from the heat source or the end portion of the second heat dissipating groove assembly away from the heat source.

9. The heat dissipating module as recited in claim 1, wherein the first heat dissipating groove assemblies and the second heat dissipating groove assemblies are corresponding with each other, and a distance between each first heat dissipating groove assembly and the heat source is equal to a distance between the second heat dissipating groove assemblies corresponding to the first heat dissipating groove assembly and the heat source substantially.

10. The heat dissipating module as recited in claim 1, further comprises a third heat dissipating fin, disposed in two sides of the combination of the first heat dissipating fins and the second heat dissipating fins.

11. The heat dissipating module as recited in claim 1, wherein each first heat dissipating groove unit and each second heat dissipating groove unit are a diamond structure, or a triangular structure.

12. The heat dissipating module as recited in claim 1, wherein the first heat dissipating groove units and the second heat dissipating groove units are interlaced with each other.

13. The heat dissipating module as recited in claim 1, wherein an overlapping area between the first heat dissipating groove unit and the second heat dissipating groove unit is smaller than 30% area of the first heat dissipating groove unit or 30% area of the second heat dissipating groove unit.

14. The heat dissipating module as recited in claim 2, wherein the fabricating direction is not vertical to a top surface of the heat source, and is parallel to the top surface of the heat source.

* * * * *